United States Patent [19]

Chen et al.

[11] Patent Number: 5,719,087

[45] Date of Patent: Feb. 17, 1998

[54] PROCESS FOR BONDING PAD PROTECTION FROM DAMAGE

[75] Inventors: Sen Fu Chen, Taipei; Jie Shing Wu; Po-Tau Chu, both of Hsin-Chu; Wen-Cheng Chang, Tauyuan, all of Taiwan

[73] Assignee: Taiwan Semiconductor Manufacturing Company, Ltd., Hsin-Chu, Taiwan

[21] Appl. No.: 612,043

[22] Filed: Mar. 7, 1996

[51] Int. Cl.⁶ .................................................. H01L 21/44
[52] U.S. Cl. .................................... 438/612; 438/613
[58] Field of Search ................................ 438/612, 613

[56] References Cited

U.S. PATENT DOCUMENTS 5,136,364  8/1992  Byrne .
5,369,299  11/1994  Byrne .
5,384,284  1/1995  Doan et al. .......................... 437/190
5,654,588  8/1997  Dasse et al. ......................... 257/754

*Primary Examiner*—John Niebling
*Assistant Examiner*—Richard A. Booth
*Attorney, Agent, or Firm*—George O. Saile; Stephen B. Ackerman

[57] ABSTRACT

A protective cap of dielectric material is deposited by plasma-enhanced chemical vapor deposition on the surface of electrical bonding pads of semiconductor integrated circuits prior to deposition of the final passivation layer. The protective cap serves to isolate the pad surface from electrochemical or other interaction with the etching solution used to open contact holes through the passivation layer. This prevents the formation of surface damage and residues on the pad which lead to yield and reliability problem with integrated circuits.

5 Claims, 2 Drawing Sheets

PROCESS FOR BONDING PAD PROTECTION FROM DAMAGE

BACKGROUND OF THE INVENTION

1. Field of the Invention

The invention relates to a method for protection of the surface of bonding pads used for electrical contacts to integrated circuits and more particularly to prevention of surface damage to such bonding pads by the chemical etching solution used to open holes to the bonding pads through the passivation layer covering the bonding pads and the rest of the integrated circuit.

2. Description of the Prior Art

In the fabrication of semiconductor integrated circuits, a protective layer known as the final passivation is deposited to cover the entire surface of the integrated circuit wafer. This is done as one of the final steps in the manufacturing process. Subsequently, contact holes must be etched through this passivation layer to allow electrical contact to be made to bonding pads on the circuit. If the etching process is not strictly controlled within narrow process limits the etching solution in contact with the bnding pads when the holes are finally opened can attack and damage the bonding pad surfaces. This leads to difficulties in subsequent bonding of electrical contacts to the pad surfaces. The attack is thought to be due to differences in electrochemical potential between the etching solution and the bonding pads, and is particularly likely to occur when the bonding pads are electrically connected to ground potential. The chemical attack is observed as a change in color and appearance of the affected bonding pads, and is cause for rejection of the integrated circuit on visual inspection. Furthermore, if the damaged surface is not detected, subsequent bonds to such pads may not be reliable, leading to failure in operation. The need to improve the quality and reliability of electrical contact to bonding pads is recognized, and U.S. Pat. No. 5,384,284, for example, teaches the use of epoxy resin to insure low-resistance reliable electrical contact to aluminum bonding pads. However, the problem of surface damage or chemical residues after etching interfering with subsequent electrical bonding is not addressed.

SUMMARY OF THE INVENTION

A principal object of the invention is to preserve the integrity of the electrical bonding pads of integrated circuits by preventing damage to such pad surfaces by chemical attack from the etch solution used to open contact holes to the pads through the protective passivation layer covering the surface of the integrated circuit. In accordance with the object of the invention, a protective cap of dielectric material is deposited by plasma-enhanced chemical vapor deposition on the surface of the electrical bonding pads of integrated circuits prior to deposition of the final protective passivation layer. The protective cap serves to isolate the pad surface from any electrochemical or other interaction with the chemical solution which is used to open contact holes through the passivation layer. This prevents the formation of surface damage and residues on the pad which could lead to yield and reliability problems with the integrated circuits.

BRIEF DESCRIPTION OF THE DRAWINGS

In the accompanying drawings forming a material part of this description, there is shown.

DESCRIPTION OF THE PREFERRED EMBODIMENT

Figure 1:
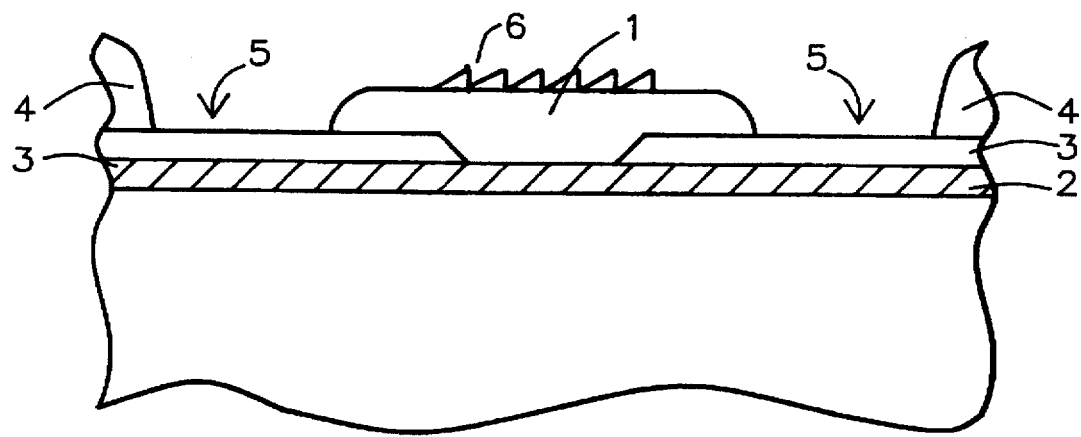
FIG. 1 is a drawing of bonding pads damaged by electrochemical interaction of the prior art.

Referring now to FIG. 1, there is shown a schematic cross-sectional diagram of the bonding pad of an integrated circuit of the prior art. The bonding pad 1 is a lamellar structure of layers of aluminum (Al), silicon (Si), and copper(Cu) from the bottom contact to underlying circuitry 2 covered by an insulating dielectric layer 3, for example. A protective passivation layer 4 is shown on top of the circuit through which a contact hole 5 has been etched open above the bonding pad to allow electrical connection to the bonding pad. The contact hole is etched open at a final stage in integrated circuit manufacture as a wafer comprising a multitude of integrated circuits before separation into individual circuit dice. The hole etching step is a photolithographic process of subtractive etching through a photoresist mask pattern employing an etching agent suitable for the material of the passivation layer. For example, a commonly-used etching substance for silicon oxide passivation layers is tetramethyl ammonium hydroxide (TMAH).

Figure 2:
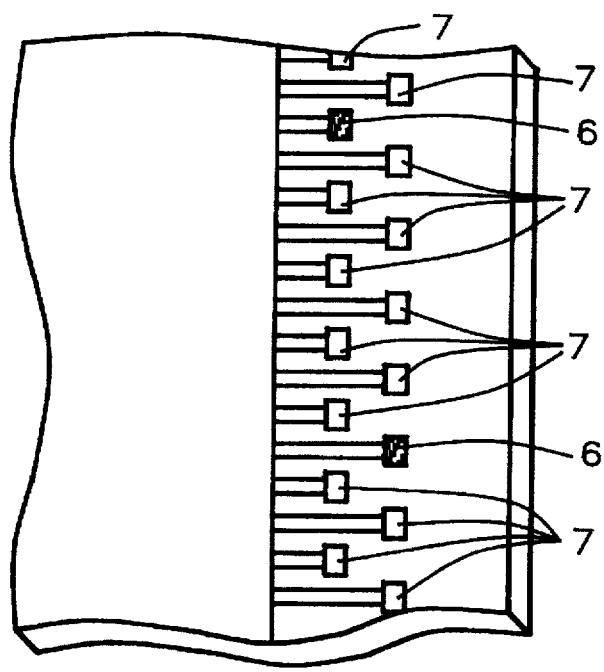
FIG. 2 is a schematic cross-sectional sketch of a bonding pad with surface damage caused by electrochemical interaction with contact hole etched through passivation layer of the prior art.
Figure 3:
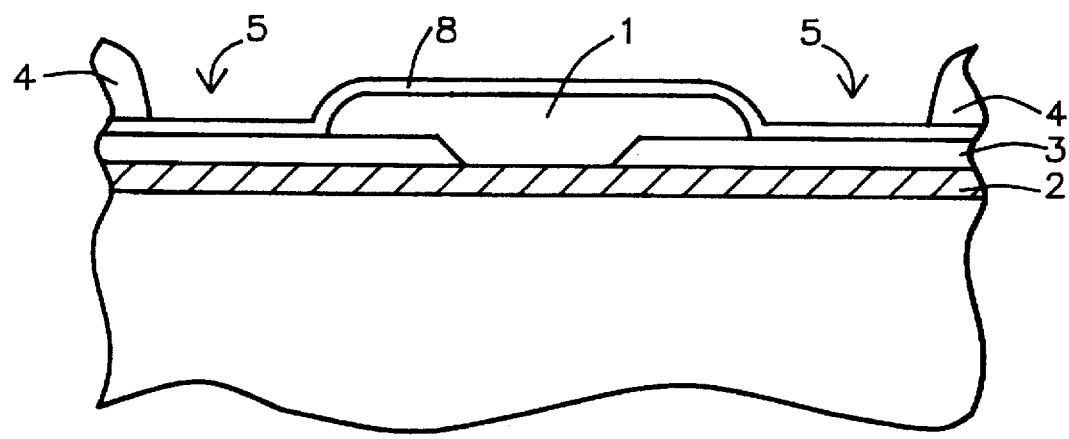
FIG. 3 is a schematic cross-sectional sketch of a protective cap on a bonding pad with contact hole etched through passivation layer.

Due to the difference in electrochemical potential between the TMAH soltion and the bonding pads, particularly those which are electrically grounded, there is the possibility of electrochemical reaction between the etchant and the surface of the bonding pad when the contact hole is fully open. Referring now to FIG. 2, such an electrochemical reaction can cause visible formation of surface layers of dark material 6 which can interfere with subsequent bonding of electrical contacts to the bonding pad by, for example, thermocompression bonding. Other bonding pads 7 which do not appear darkened are still subject to various degrees of attack as the potential difference between the pads and the etching solution is not normally controlled and may vary considerably, Referring now to FIG. 3, the structure of the bonding pad of the current invention will be described. At a point in the manufacturing process immediately prior to the final passivation, a thin layer of a dielectric material is deposited over the surface of the integrated circuit to form a protective cap 8 over the bonding pad 1. The cap formation is accomplished by chemical vapor deposition of a dielectric and chemically resistant material, such that when contact holes are etched open in the subsequently-deposited passivation layer, the bonding pad surface is isolated electrically and chemically from the etching solution. A preferred process for the deposition of the cap layer is plasma-enhanced chemical vapor deposition (PECVD) of materials such as, for example, silicon oxide ($SiO_2$) and silicon nitride ($Si_3N_4$), since they possess the requisite properties and the process is very compatible with other manufacturing processes such as the passivation process, for example. The use of other deposited materials for the purpose of forming the cap layer will be suggested to those skilled in the art.

The thickness of the cap layer is determined by the need to be free of pinholes and other defects and the requirement that the subsequent formation of electrical contact to the bonding pad be successfully accomplished. In the case of the preferred materials $SiO_2$ or $Si_3N_4$, it has been found that a thickness range of between about 0.05 and 0.1 micron is particularly useful but not limiting.

While the invention has been particularly shown and described with reference to the preferred embodiments thereof; it will be understood by those skilled in the art that various changes in form and details may be made without departing from the spirit and scope of the invention.

What is claimed is:

1. A method for forming an improved bonding pad on a semiconductor integrated circuit:

forming said bonding pad of aluminum, silicon, and copper on a semiconductor integrated circuit substrate;

covering said bonding pad with a protective cap of a dielectric material prior to final passivation, which material is resistant to electrochemical interaction with a solution suitable to etch contact holes in the final passivation layer; and etching contact holes through said final passivation layer with said etching solution while said protective cap is on said bonding pad to expose said protective cap.

2. The method of claim 1 wherein the dielectric material is taken from the group consisting of silicon oxide ($SiO_2$) and silicon nitride ($Si_3N_4$) deposited by a PECVD process.

3. The method of claim 2 wherein said dielectric material layer thickness is between about 0.05 and 0.1 micron.

4. The method of claim 1 wherein said bonding pad is electrically connected to ground potential.

5. The method of claim 1 wherein the final passivation layer contact hole etching is performed with a solution of tetramethyl ammonium hydroxide.

* * * * *